(12) United States Patent
Takashima et al.

(10) Patent No.: US 8,178,893 B2
(45) Date of Patent: May 15, 2012

(54) SEMICONDUCTOR ELEMENT MOUNTING SUBSTRATE, SEMICONDUCTOR DEVICE USING THE SAME, AND METHOD FOR MANUFACTURING SEMICONDUCTOR ELEMENT MOUNTING SUBSTRATE

(75) Inventors: Kouichi Takashima, Itami (JP); Hideaki Morigami, Tokyo (JP); Masashi Narita, Itami (JP)

(73) Assignee: A. L. M. T. Corp., Tokyo (JP)

( * ) Notice: Subject to any disclaimer, the term of this patent is extended or adjusted under 35 U.S.C. 154(b) by 933 days.

(21) Appl. No.: 12/087,214

(22) PCT Filed: Dec. 21, 2006

(86) PCT No.: PCT/JP2006/325544
§ 371 (c)(1),
(2), (4) Date: Jun. 27, 2008

(87) PCT Pub. No.: WO2007/074720
PCT Pub. Date: Jul. 5, 2007

(65) Prior Publication Data
US 2009/0057705 A1  Mar. 5, 2009

(30) Foreign Application Priority Data
Dec. 28, 2005  (JP) .................................. 2005-380007

(51) Int. Cl.
*H01L 33/64* (2010.01)
(52) U.S. Cl. .......... 257/99; 257/717; 257/720; 257/729; 257/E23.023; 257/E23.075
(58) Field of Classification Search .................... 257/99, 257/717, 720, 729, E23.023, E33.075
See application file for complete search history.

(56) References Cited

U.S. PATENT DOCUMENTS

| 6,171,691 | B1 | 1/2001 | Nishibayashi | |
|---|---|---|---|---|
| 6,270,848 | B1 | 8/2001 | Nishibayashi | |
| 2004/0119161 | A1 | 6/2004 | Saito et al. | |
| 2005/0051891 | A1* | 3/2005 | Yoshida et al. | 257/720 |
| 2005/0212140 | A1* | 9/2005 | Fujinaga et al. | 257/772 |
| 2006/0220173 | A1* | 10/2006 | Gan et al. | 257/528 |

FOREIGN PATENT DOCUMENTS

JP  10-223812  8/1998
(Continued)

*Primary Examiner* — Minchul Yang
(74) *Attorney, Agent, or Firm* — Rabin & Berdo, P.C.

(57) ABSTRACT

The invention provides a semiconductor element mounting substrate that, by virtue of an improvement in thermal conduction efficiency between the substrate and another member, can reliably prevent, for example, a light emitting element such as a semiconductor laser from causing a defective operation by heat generation of itself, by taking full advantage of high thermal conductivity of a diamond composite material. In the semiconductor element mounting substrate, a connecting surface to be connected with the light emitting element or the like is finished such that the number, per unit area, of at least either recesses or protrusions having a depth or height of 10 μm to 40 μm and a surface-direction diametrical size of 10 μm to 3 mm is 50/cm² or less, and on the connecting surface, a coating layer, which is formed of a solder or a brazing material, has a thickness of 1 μm to 30 μm, an arithmetic mean roughness $R_a$ of a roughness curve showing a surface roughness of $R_a \leq 2$ μm, and a maximum height roughness $R_z$ of $R_z \leq 15$ μm, and fills and covers the recesses or protrusions, is formed.

18 Claims, 1 Drawing Sheet

FOREIGN PATENT DOCUMENTS

| | | |
|---|---|---|
| JP | 2003-309316 | 10/2003 |
| JP | 2004-175626 | 6/2004 |
| JP | 2004-197153 | 7/2004 |
| JP | 2004-200346 | 7/2004 |
| JP | 2005-175006 | 6/2005 |
| JP | 2005-184021 | 7/2005 |

* cited by examiner

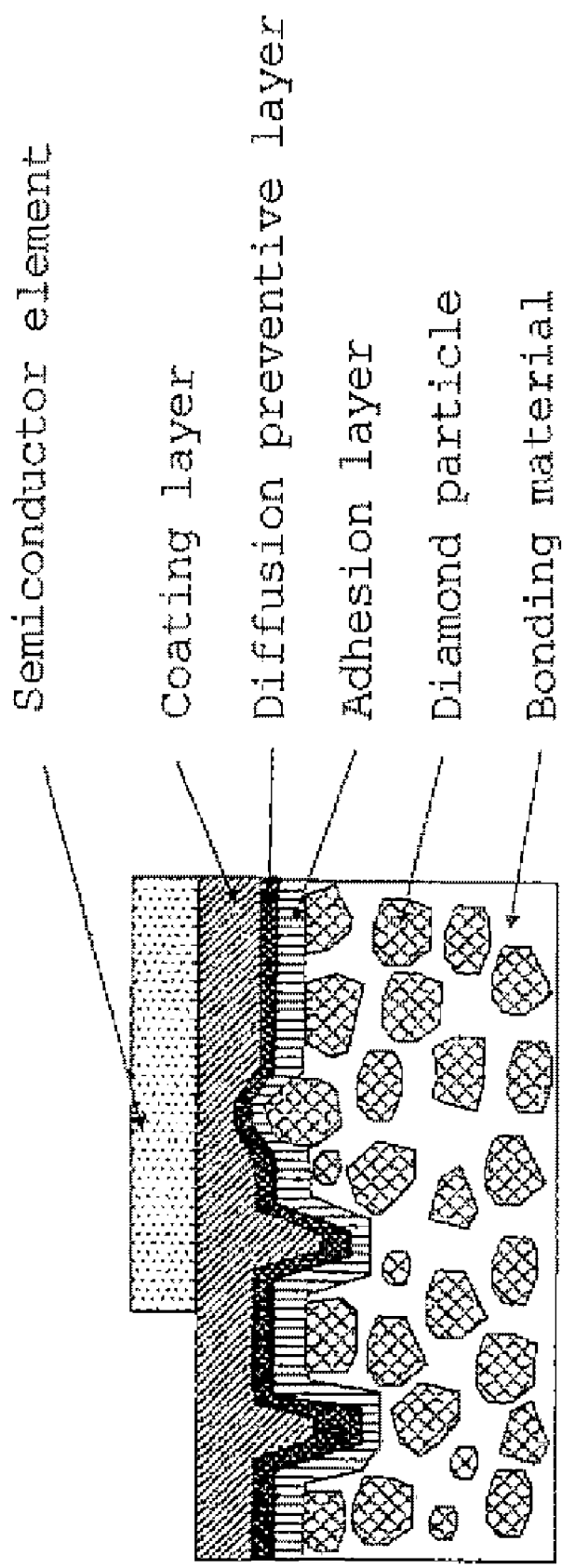

SEMICONDUCTOR ELEMENT MOUNTING SUBSTRATE, SEMICONDUCTOR DEVICE USING THE SAME, AND METHOD FOR MANUFACTURING SEMICONDUCTOR ELEMENT MOUNTING SUBSTRATE

TECHNICAL FIELD

The present invention relates to a semiconductor element mounting substrate formed of a diamond composite material in which a number of fine diamond particles are bonded by a bonding material formed of a metal or a ceramic, a semiconductor device using the semiconductor element mounting substrate, and a method for manufacturing the semiconductor element mounting substrate.

BACKGROUND ART

In order to prevent a light emitting element such as a semiconductor laser from causing a defective operation by heat generation of itself, it has been necessary that a semiconductor element mounting substrate (a heat sink, a heat transferring substrate, a housing, or the like) to which the light emitting element is connected is excellent in heat transfer characteristics, and conventionally, the semiconductor element mounting substrate has been generally formed of a ceramic such as AlN or SiC, that is high in thermal conductivity and has a favorable heat transfer characteristics. However, with a higher power output by a light emitting element in recent years, a higher degree of heat transfer characteristics has come to be demanded in a semiconductor element mounting substrate than what it currently has.

Therefore, in order to meet the above-mentioned demand, it was proposed to form the semiconductor element mounting substrate using a diamond composite material in which a number of fine diamond particles are bonded by, for example, a metal such as Cu or Ag or a ceramic such as SiC. This was based on a consideration that since diamond has the highest thermal conductivity among all the substances, by using the diamond composite material to form a semiconductor element mounting material, the thermal conductivity thereof can be dramatically improved in comparison with that of a conventional one formed of a ceramic or the like.

In order to conduct heat as smoothly as possible between a semiconductor element mounting substrate formed of a diamond composite material and a semiconductor element such as a light emitting element to be connected (mounted) to the semiconductor element mounting substrate or another heat transferring member thermally connected to a semiconductor element mounting substrate and assisting in heat transfer from a semiconductor element (hereinafter, these are sometimes generally called "another member", it is necessary that the semiconductor element mounting substrate and another member are connected, via a layer of a solder or brazing material, in a closely adhered state with as small a gap as possible therebetween.

And, for this, it is necessary that a connecting surface, connected with another member, of a semiconductor element mounting substrate formed of a diamond composite material, such as an element mounting surface to be connected with a semiconductor element or a heat transfer surface to thermally connect another heat transferring member to the semiconductor element mounting substrate, is finished as smooth as possible. Therefore, for finishing the connecting surface of the semiconductor element mounting substrate smooth, the connecting surface has been conventionally polished by use of a diamond whetstone or the like. Moreover, the polished connecting surface has been coated with a metal film.

For example, in Patent Document 1, it is described that a semiconductor laser mounting sub-carrier serving as a semiconductor element mounting substrate is formed of the diamond composite material, that a connecting surface of the sub-carrier is polished such that an arithmetic mean roughness $R_a$ of a roughness curve, showing a surface roughness, prescribed in Japanese Industrial Standards JIS B 0601:2001 "Geometrical Product Specification (GPS)—Surface Texture: Profile method—Terms, definitions and surface texture parameters," becomes $R_a \leq 0.5$ μm, and that the polished connecting surface is coated with a first metal film made of at least one type of metal selected from a group consisting of Ni, Cr, Ti and Ta and a second metal film made of at least one type of metal selected from a group consisting of Mo, Pt, Au, Ag, Sn, Pd, Ge and In, in this order.

Moreover, it is described in Patent Documents 2 and 3, respectively, that a heat sink serving as a semiconductor element mounting substrate is formed of the diamond composite material and a connecting surface of the heat sink is polished so that an arithmetic mean roughness $R_a$ becomes 0.2 μm or less in Patent Document 2 and 0.5 μm or less in Patent Document 3, and that the polished connecting surface is coated with the same first and second metal films as in the above.

However, since it takes a long time to polish a connecting surface of a semiconductor element mounting substrate formed of a diamond composite material by use of a diamond whetstone or the like until it reaches the predetermined surface roughness, so that there is a problem that productivity of a semiconductor element mounting substrate declines and the manufacturing cost rises. When the connecting surface is polished up to the predetermined surface roughness by flat polishing using, for example, a #100 to #400 diamond whetstone, it takes approximately 20 hours or more to finish one connecting surface.

In addition, even if a connecting surface could be polished to the predetermined surface roughness, since a large number of recesses produced by diamond particles dropped at polishing and protrusions caused by diamond particles remaining unpolished exist on the connecting surface, unevenness formed on the connecting surface by the recesses and the protrusions hinders adhesion of the connecting surface with another member such as a light emitting element via a layer of a solder or brazing material, so that a gap is easily formed therebetween, and the gap causes a decline in thermal conduction efficiency between the semiconductor element mounting substrate and another member.

Moreover, even if adhesion could be achieved without a gap therebetween, the recesses existing on the connecting surface remain at an interface therebetween as voids to hinder thermal conduction and still causes a decline in thermal conduction efficiency between the semiconductor element mounting substrate and another member, so that there is also a problem that neither case of these can take full advantage of favorable thermal conductivity of the diamond composite material. Therefore, the conventional semiconductor element mounting substrates described in Patent Documents 1 to 3 cannot sufficiently cope with a further higher power output by a light emitting element such as a semiconductor laser in recent years, and under the present circumstances, an effect to prevent the light emitting element or the like from causing a defective operation by heat generation of itself has come to be insufficient.

Moreover, the sizes of the recesses and protrusions have, dependent on the particle size of diamond particles, large depth and height of approximately 5 μm to 300 μm, while the thicknesses of the metal films formed on the connecting surface in Patent Documents 1 to 3 are considerably small in comparison therewith. For example, in Example 3 of Patent Document 1, the maximum thickness of an Ni film serving as the first metal film is set to 2 μm, and the thickness of an Au film serving as the second metal film is set to 0.2 μm, so that the total thickness is a mere 2.2 μm at a maximum. Moreover, in Example 3 of Patent Document 3, the thickness of an Ni film serving as the first metal film is set to 1 μm, and the thickness of a Pt film serving as the second metal film is set to 0.2 μm, so that the total thickness is a mere 1.2 μm. Therefore, there is also a problem that, even if the connecting surface is coated with the two layers of the metal films, it is impossible to fill and cover the recesses and protrusions therewith, that is, to fill the recesses with the metals to form the metal films so as not to remain as voids and to flatten the connecting surface with the recesses and protrusions buried in the metal films.

In Patent Document 4, it is described that a heat spreader serving as a semiconductor element mounting substrate is formed of the diamond composite material and a Cu material layer larger in thickness than the metal films explained in the foregoing is formed on a connecting surface of the heat spreader so as to fill and cover recesses and protrusions, to thereby provide the surface of the Cu material layer as a smooth surface. According to the configuration, the problems, explained in the foregoing, that unevenness formed on the connecting surface by the recesses and protrusions hinders adhesion of the connecting surface with another member such as alight emitting element, so that a gap is formed therebetween, and the recesses remain at an interface therebetween as voids to hinder thermal conduction, can be solved. Therefore, it becomes possible to mutually connect the connecting surface and another member without a gap therebetween via a layer of a solder or brazing material.

Patent Document 1: Japanese Unexamined Patent Publication No. 2003-309316 (Claims 1, 5, and 6, Paragraph 0014 to Paragraph 0015, Paragraph 0025 to Paragraph 0028, FIG. 2)

Patent Document 2: Japanese Unexamined Patent Publication No. 2004-175626 (Claims 1, 6, 7, and 9, Paragraph 0018, Paragraph 0019)

Patent Document 3: Japanese Unexamined Patent Publication No. 2005-184021 (Claims 1, 2, and 4, Paragraph 0027 to Paragraph 0028, Paragraph 0050 to Paragraph 0051, FIG. 7)

Patent Document 4: Japanese Unexamined Patent Publication No. 2005-175006 (Claims 1 and 4, Paragraph 0009 to Paragraph 0011, Paragraph 0018, Paragraph 0020, Paragraph 0024, FIG. 1, FIG. 2)

DISCLOSURE OF THE INVENTION

Problems to be Solved by the Invention

However, according to the inventors' research, it was discovered that, since the layer of a Cu material with such a large thickness as to be able to fill and cover recesses and protrusions existing on the connecting surface of a semiconductor element mounting substrate as described in Patent Document 4 is lower in thermal conductivity of Cu than the thermal conductivity of the diamond composite material, as explained in the foregoing, although the layer has a smooth surface and the surface and another member can be closely adhered without a gap therebetween via a layer of a solder or brazing material, an effect to improve thermal conduction efficiency with another member cannot be sufficiently obtained. Moreover, it was also discovered that, since the Cu material layer has a large thickness and a high internal stress besides a large difference in thermal expansion coefficient from the diamond composite material, the Cu material layer is easily separated due to a thermal history when a semiconductor element such as a light emitting element is connected onto the layer via a layer of a solder or brazing material, or due to a thermal history by heat generation of the element itself or the like when the connected semiconductor element is driven.

It is an object of the present invention to provide a semiconductor element mounting substrate that, by virtue of a further improvement in thermal conduction efficiency between the substrate and another member than before, can more reliably prevent than before, for example, a light emitting element such as a semiconductor laser from causing a defective operation by heat generation of itself, by taking full advantage of high thermal conductivity of a diamond composite material. Moreover, it is an object of the present invention to provide a semiconductor device that can prevent a light emitting element connected to a connecting surface, of the semiconductor element mounting substrate of the present invention, coated with a coating layer from causing a defective operation by heat generation of itself, so that the light emitting element emit light for a longer period of time than before. Further, it is an object of the present invention to provide a method for manufacturing the semiconductor element mounting substrate of the present invention having excellent characteristics as explained in the foregoing efficiently and with a high productivity.

Means for Solving the Problems

The present invention provides a semiconductor element mounting substrate including a substrate body formed of a diamond composite material in which a number of diamond particles are bonded by a bonding material and which has a connecting surface to be connected with another member, wherein the connecting surface of the substrate body is finished such that a number of at least either recesses or protrusions having a depth or height of 10 μm to 40 μm and a surface-direction diametrical size of 10 μm to 3 mm, per unit area of the connecting surface, is 50/cm$^2$ or less, on at least the connecting surface of the substrate body, a coating layer formed of a solder or a brazing material is formed in a manner filling and covering the recesses or protrusions, and the coating layer has a thickness in a region of the connecting surface other than the recesses or protrusions of 1 μm to 30 μm, an arithmetic mean roughness $R_a$ of a roughness curve showing a surface roughness of $R_a \leq 2$ μm, and a maximum height roughness $R_z$ of $R_z \leq 15$ μm.

According to the present invention, the connecting surface, for another member, of the substrate body formed of the diamond composite material is finished so that, as mentioned above, a relatively small number of recesses and projections exist on its surface, the coating layer formed of a solder or brazing material is formed thereon to fill and cover the recesses and protrusions, that is, to fill the recesses with a solder or brazing material to form a coating layer so as not to remain as voids and to bury the recesses and the protrusions in the coating layer, and the coating layer is finished with the predetermined thickness and surface roughness so as to be flattened, so that another member such as a light emitting element can be adhered to the surface of the coating layer without a gap.

Moreover, the solder or brazing material to form the coating layer has a favorable wettability, when being melted, to the substrate body and another member, and thus by heating to melt the coating layer and then cooling to solidify the same while overlapping another member with the connecting surface of the semiconductor element mounting substrate via the coating layer, another member can be connected to the connecting surface in a closely adhered state via the coating layer without a gap. Moreover, in the connected state, between the substrate body and another member, no copper layer with a such large thickness as to cause a decline in thermal conduction efficiency is interposed, and as a layer with a relatively large thickness, only the coating layer of a solder or brazing material, which is a layer indispensable for joining another member, is interposed, so that thermal conduction efficiency between the both layers can further be improved than before. Therefore, it becomes possible to reliably prevent, for example, the light emitting element such as a semiconductor laser from causing a defective operation by heat generation of itself, by taking full advantage of high thermal conductivity of a diamond composite material.

Moreover, since the coating layer formed of a solder or brazing material is softer than the diamond composite material and is thus easily processed by polishing or the like, there is also an advantage that it does not take a long time to finish the surface of the coating layer, formed on the connecting surface of the substrate body of the diamond composite material in a manner filling and covering recesses or protrusions, by the polishing or the like to the predetermined surface roughness, compared with the conventional cases. Furthermore, since the coating layer has a favorable wettability to the substrate body and semiconductor element and also has a thickness of 1 μm to 30 μm as explained in the foregoing, there is also an advantage that the coating layer is hardly separated from the substrate body due to a thermal history when a semiconductor element is connected onto the layer or a thermal history by heat generation of the element itself when the connected semiconductor element is driven.

As the bonding material that bonds diamond particles to form a diamond composite material to be a substrate body, in consideration of bonding the diamond particles further tightly, without spoiling high thermal conductivity of diamond, to increase the substrate body of the diamond composite material in mechanical strength and thermal resistance, at least one type substance selected from a group consisting of Cu, Ag, Si, and SiC is preferable. Moreover, the substrate body formed of the diamond composite material has a thermal conductivity of 200 W/m·K or more, in consideration of transferring heat generated from the semiconductor element connected to the element mounting surface as speedily as possible. Moreover, in consideration of preventing a large expansion and contraction due to a thermal history when a semiconductor element is connected to the connecting surface or when the semiconductor element is operated, to prevent application of an excessive stress to the semiconductor element connected to the element mounting surface, thereby preventing the semiconductor element from being damaged or disconnected, the substrate body preferably has a thermal expansion coefficient of $10 \times 10^{-6}$/K or less.

In consideration of being speedily melted by heating when a semiconductor element is connected to an element mounting surface or when another heat transferring member is connected to a heat transfer surface, being not greatly reduced in connection strength or not melted due to a thermal history when the semiconductor element is operated, and being excellent in thermal conductivity and connection durability, the coating layer is preferably formed of a solder or brazing material containing at least one type of metal selected from a group consisting of In, Sn, Ag, Au, Ge, Si, Cu, Ti, Nb, V and Al, and more preferably formed of an Au—Sn-based, In—Sn-based or Au—Ge-based solder or brazing material. Moreover, the coating layer preferably includes a first coating layer formed of a solder or brazing material and formed on the connecting surface of the substrate body, and a second coating layer formed of a solder or brazing material having a melting point lower than the solder or brazing material to form the first coating layer and laminated on the first coating layer.

According to the abovementioned configuration, for example, by setting the heating temperature when connecting a semiconductor element to an element mounting surface or when connecting another heat transferring member to a heat transfer surface lower than a melting temperature of the first coating layer and higher than a melting temperature of the second coating layer, the first coating layer is prevented from melting when being heated, and the first coating layer can be maintained in a solid state. Therefore, by melting the second coating layer while maintaining a state where recesses and protrusions on the connecting surface of a substrate body are filled and covered by the first coating layer, a semiconductor element can be connected to an element mounting surface serving as the connecting surface or another heat transferring member can be connected to a heat transfer surface, so that a decline in thermal conduction efficiency due to a gap or voids formed between the substrate body and another member can be reliably prevented. Also, in consideration of improving adhesion between the first coating layer and the second coating layer, the first coating layer and the second coating layer are preferably formed of solders or brazing materials of the same base and different composition distribution, and more preferably formed of Au—Sn-based, In—Sn-based or Au—Ge-based solders or brazing materials, respectively.

When an adhesion layer made of at least one type of metal selected from a group consisting of Ni, Au, Ti and Cr or a compound containing the metal(s) is formed between the substrate body and the coating layer, a function of the coating layer can improve adhesion between the substrate body and the coating layer to increase the strength of connection, to the substrate body, of another member to be connected onto the coating layer. Moreover, when at least one diffusion preventive layer made of at least one type of metal selected from a group consisting of Pt, Mo, and Pd is formed between the adhesion layer and the coating layer, a function of the diffusion preventive layer can prevent the metal from being diffused from the adhesion layer and the composition of the solder or brazing material forming the coating layer from being thus changed, when the coating layer is melted by heating when connecting a semiconductor element to an element mounting surface or when connecting another heat transferring member to a heat transfer surface.

In a coating layer with a double layer structure, a first coating layer is preferably formed of an Ag—Cu-based brazing material and the second coating layer is formed of a solder or brazing material of a base different from the Ag—Cu-based brazing material and having a melting point lower than the Ag—Cu-based brazing material. In such a construction, since the Ag—Cu-based brazing material forming the first coating layer has a higher flowability than that of a solder or brazing material of an Au—Su-base or the like when being melted, by forming the first coating layer of the Ag—Cu-based brazing material, the recesses and protrusions on the connecting surface of the substrate body can be further reliably filled and covered with the first coating layer. Moreover, since an Ag—Cu-based brazing material is higher not only in thermal conductivity but also in melting point than a solder or brazing material of an Au—Sn base or the like, by forming the first coating layer of the Ag—Cu-based brazing material, thermal conduction efficiency of the first coating layer can be improved, and connection durability thereof can also be improved.

Also, in consideration of improving adhesion of the first coating layer to the substrate body formed of the diamond composite material, as the Ag—Cu-based brazing material, an active Ag—Cu-based brazing material containing at least one of Cu, Ti, Nb and V and having a favorable wettability to the substrate body is preferably used. Moreover, the second coating layer is preferably formed of an Au—Sn-based, In—Sn-based or Au—Ge-based solder or brazing material which can efficiently connect a semiconductor element or the like at a lower temperature without damaging the semiconductor element or the like.

When an adhesion layer made of at least one type of metal selected from a group consisting of Ni, Au, Ti and Cr or a compound containing the metal(s) is formed between the first coating layer formed of an Ag—Cu-based brazing material and the second coating layer formed of a solder or brazing material of a base such as the Au—Sn base, different from the Ag—Cu-based brazing material, by a function of the adhesion layer, adhesion between the first coating layer and the second coating layer can be improved to increase the strength of connection, to the substrate body, of another member to be connected onto the second coating layer.

Also, when at least one diffusion preventive layer made of at least one type of metal selected from a group consisting of Pt, Mo, and Pd is formed between the adhesion layer and the second coating layer, this can prevent, by a function of the diffusion preventive layer, the metal from being diffused from the first coating layer to change the composition of the solder or brazing material to form the second coating layer, when the second coating layer is melted by heating when connecting a semiconductor element to an element mounting surface or when connecting another heat transferring member to a heat transfer surface.

The present invention provides a semiconductor device in which a light emitting element serving as a semiconductor element is connected via the coating layer to the connecting surface, coated with the coating layer, of the semiconductor element mounting substrate of the present invention. According to the present invention, heat generated from the light emitting element can be speedily transferred through the semiconductor element mounting substrate, so that it becomes possible to prevent the light emitting element from causing a defective operation by heat generation of itself and to make the light emitting element emit light for a longer period of time than before.

The present invention provides a method for manufacturing the semiconductor element mounting substrate of the present invention, including the steps of:

finishing a connecting surface of a substrate body such that a number of at least either recesses or protrusions having a depth or height of 10 μm to 40 μm and a surface-direction diametrical size of 10 μm to 3 mm, per unit area of the connecting surface, is 50/cm² or less;

forming a coating layer to fill and cover the recesses or protrusions by thickly applying a solder or brazing material to at least the connecting surface of the substrate body; and finishing the coating layer so as to have a thickness in a region of the connecting surface other than the recesses or protrusions of 1 μm to 30 μm, an arithmetic mean roughness $R_a$ of a roughness curve showing a surface roughness of $R_a \leq 2$ μm, and a maximum height roughness $R_z$ of $R_z \leq 5$ μm.

According to the present invention, a semiconductor element mounting substrate having excellent characteristics can be manufactured efficiently and with a high productivity, as explained in the foregoing. Moreover, when the semiconductor element mounting substrate is finished so as to have a predetermined thickness and surface state through a step of once heating to melt the thickly applied coating layer and then cooling to solidify the same and a step of polishing the coating layer, the recesses and protrusions on the connecting surface can be reliably filled and covered with the molten solder or brazing material which forms the coating layer, so that it becomes possible to further reliably prevent the recesses from remaining as voids to hinder thermal conduction, particularly.

Effects of the Invention

According to the present invention, by virtue of a further improvement in thermal conduction efficiency between the substrate and another member than before, it becomes possible to provide a semiconductor element mounting substrate that can more reliably prevent than before, for example, a light emitting element such as a semiconductor laser from causing a defective operation by heat generation of itself, by taking full advantage of high thermal conductivity of a diamond composite material. Moreover, according to the present invention, it becomes possible to provide a semiconductor device that can prevent a light emitting element connected to a connecting surface, of the semiconductor element mounting substrate of the present invention, coated with a coating layer, from causing a defective operation by heat generation of itself to make the light emitting element emit light for a longer period of time than before. Further, according to the present invention, it becomes possible to provide a method for manufacturing the semiconductor element mounting substrate of the present invention having excellent characteristics as explained in the foregoing efficiently and with a high productivity.

MODE FOR CARRYING OUT THE INVENTION

As illustrated in FIG. 1, a semiconductor element mounting substrate of the present invention includes a substrate body formed of a diamond composite material in which a number of diamond particles are bonded by a bonding material, and a coating layer formed on at least a connecting surface of the substrate body for connecting with another member. Of these, the substrate body formed of the diamond composite material can be formed in the same manner as with the conventional case. Particularly, a semiconductor element mounting substrate manufactured by the manufacturing method using an ultra-high pressure generating device described in Patent Documents 1 to 3 explained in the foregoing can be suitably employed as the substrate body.

More specifically, the substrate body is manufactured by filling diamond particles and the bonding material into a capsule formed of molybdenum or the like when a metal such as Cu, Ag, or Si is used as a bonding material, and filling diamond particles alone or a mixture of diamond particles and Si powder to be the bonding material into a capsule formed of Si and SiC when a ceramic such as SiC is used as a bonding material, and heating while pressurizing to sinter them in a vacuum, in an inert gas atmosphere or in a reducing atmosphere then removing the capsule, and then processing them into the shape of a predetermined substrate body, and finishing a connecting surface thereof so as to have a predetermined surface state by one type or two or more types of processing, such as cutting by electric discharge machining, polishing with a diamond whetstone or the like, or blasting.

The pressurization pressure during sintering is preferably 1 Gpa to 6 Gpa, and particularly 4 Gpa to 6 Gpa. The heating temperature is preferably 1100° C. to 1500° C., and particularly 1100° C. to 1200° C., when the bonding material is a metal such as Cu, and 1400° C. to 1500° C. when the bonding material is a ceramic such as SiC. At the time of sintering, it is preferable that the capsule is heated to the above-mentioned temperature range under the abovementioned pressure to melt the bonding material and infiltrate the same between diamond particles, and then, while the pressure is held, the temperature is lowered to 900° C. or less and held for a fixed time to solidify the bonding material, and then the pressure and temperature are returned to normal, and the capsule is collected.

As the diamond particles, any particles of diamond having a theoretical thermal conductivity of 2000 W/m·K, the highest thermal conductivity among substances, can be used. The diamond particles preferably have an average particle diameter of 5 μm to 40 μm, and particularly 10 μm to 30 μm, in consideration of reducing the size of recesses and protrusions produced on the connecting surface of the substrate body as much as possible while maintaining favorable thermal conductivity due to the diamond particles. On the surface of the diamond particles, a coating layer made of the same material as the bonding material may be formed as described in Patent Document 3, for example.

As the bonding material, in consideration of bonding the diamond particles further tightly without spoiling the high thermal conductivity of diamond, to increase mechanical strength and thermal resistance of the substrate body formed of the diamond composite material, at least one type selected from a group consisting of Cu, Ag, Si, and SiC explained in the foregoing is preferably used. The blending ratio of the bonding material and diamond particles is preferably set such that the ratio of diamond particles in the total volume of the diamond composite material is 50% by volume to 90% by volume, and particularly 50% by volume to 80% by volume, in consideration of bonding the diamond particles further tightly without impairing the high thermal conductivity of diamond, to increase mechanical strength and thermal resistance of the substrate body formed of the diamond composite material.

This makes it possible that the thermal conductivity of the substrate body is 200 W/m·K or more, and particularly 300 W/m·K to 600 W/m·K, so as to transfer heat generated from the semiconductor element connected to the element mounting surface as speedily as possible. Moreover, by setting the thermal expansion coefficient of the substrate body to $10\times10^{-6}$/K or less, and particularly $4\times10^{-6}$/K to $8\times10^{-6}$/K, to prevent a large expansion and contraction due to a thermal history when a semiconductor element is connected to the connecting surface or when the semiconductor element is operated, application of an excessive stress to the semiconductor element connected to the element mounting surface is prevented, so that it becomes possible to prevent the semiconductor element from being damaged or disconnected. For adjusting the thermal conductivity and thermal expansion coefficient of the substrate body, it is sufficient to adjust the particle size and the ratio of diamond particles within the ranges explained in the foregoing, to change the type of the bonding material, and adjust the sintering conditions within the ranges explained in the foregoing.

It is necessary that the connecting surface of the substrate body (that is, an element mounting surface to be connected with a semiconductor element, a heat transfer surface to thermally connect another heat transferring member, or the like) is finished such that the number of at least either of recesses or protrusions having a depth or height of 10 μm to 40 μm and a surface-direction diametrical size of 10 μm to 3 mm is $50/cm^2$ or less per unit area of the connecting surface, by applying the one type or two or more types of processing, such as cutting by electric discharge machining, polishing with a diamond whetstone or the like, or blasting explained in the foregoing. When the number of recesses or protrusions is larger than the range, even if the connecting surface is coated with a coating layer formed of a solder or a brazing material, the surface cannot be finished smooth, and thus another member such as a semiconductor element cannot be connected via the coating layer to the connecting surface in a closely adhered state without a gap.

On the other hand, when the number of recesses and protrusions existing on the connecting surface is within the range of not more than $50/cm^2$, by coating the connecting surface with a coating layer formed of a solder or brazing material to fill and cover the recesses and protrusions, it becomes possible to finish the surface of the coating layer as smooth as possible so as to connect another member such as a semiconductor element to the connecting surface via the coating layer in a closely adhered state without a gap. Moreover, for finishing the surface such that the number of recesses and protrusions existing on the connecting surface is within the range, it is not necessary to perform a long-time processing as in the conventional case. For example, by flat polishing with a diamond whetstone, it is sufficient to perform polishing by use of a #100 to #400 diamond whetstone for approximately 1 to 5 hours. Therefore, productivity of the semiconductor element mounting substrate can be improved to reduce the manufacturing cost. In consideration of finishing the surface of the coating layer as smooth as possible, it is preferable that the number of recesses and protrusions existing on the connecting surface is as small as possible, even within the range.

However, as explained in the foregoing, it takes a long time to polish the connecting surface of the substrate body formed of the diamond composite material so as to finish the same smooth, and moreover, the recesses and protrusions cannot be completely eliminated no matter how much the connecting surface is polished, and in the present invention, it is easy to coat the connecting surface with a coating layer so as to fill and cover the recesses and protrusions and finish the surface of the coating layer smooth. Therefore, in consideration of productivity and the like of the semiconductor element mounting substrate, it is preferable that the number of recesses and protrusions existing on the connecting surface is $3/cm^2$ or more, and particularly $10/cm^2$ to $40/cm^2$, even within the range. In the present invention, the number of recesses and protrusions is shown as a result obtained by counting, by use of a microscope with a magnification of ×20, the number of recesses and protrusions confirmed in a viewing field of φ11 mm of the microscope at arbitrary 10 spots in the connecting surface to define the number, converting the counts to the number per 1 $cm^2$, and then taking an average of the converted counts.

As the solder or brazing material to form a coating layer to be formed on at least the connecting surface of the substrate body, any of the conventionally known various solder or brazing materials having a favorable wettability, when being melted, with both of the substrate body formed of the diamond composite material and another member, such as a semiconductor element, to be connected to the connecting surface of the semiconductor body can be used. However, in consideration of forming a coating layer that is speedily melted by heating when a semiconductor element is connected to an element mounting surface or when another heat transferring member is connected to a heat transfer surface, and that is not greatly reduced in connection strength or not melted due to a thermal history when the semiconductor element is operated, and that is excellent in thermal conductivity and connection durability, as the solder or the brazing material, a solder or brazing material that contains at least one type of metal selected from a group consisting of In, Sn, Ag, Au, Ge, Si, Cu, Ti, Nb, V and Al and is lead-free is preferable.

Particularly, in consideration that a semiconductor element mounting substrate, connected with a semiconductor element at its element mounting surface serving as a connecting surface, is further connected with a Cu base carrier or the like serving as another heat transferring member by a low-melting-point lead-free solder or the like, it is preferable that a coating layer to be formed on the element mounting surface is formed of a solder or brazing material higher in melting point than the lead-free solder or the like, and a solder or brazing material formed of an Au—Sn-based, In—Sn-based, or Au—Ge-based alloy is particularly preferable.

In order to form the coating layer on at least the connecting surface of the substrate body, any of the conventionally known film forming methods, such as a vacuum deposition method, a sputtering method, an ion plating method, a chemical plating method and an electroplating method, can be adopted. Moreover, a coating layer may be formed by heating to melt a foil-like preform formed of a solder or brazing material to form a coating layer in a state laminated on the connecting surface of the substrate body.

In order to connect another member to the connecting surface of the substrate body in a closely adhered state without a gap, it is necessary for a coating layer to fill and cover recesses and protrusions, that is, to fill the recesses with a solder or brazing material to form a coating layer so that the recesses do not remain as voids and to bury recesses and protrusions in the coating layer. Moreover, it is necessary that the thickness in a smooth region of the connecting surface of the coating layer other than the recesses and protrusions is 1 μm to 30 μm. In order to form a coating layer that satisfies these conditions, first, by the various methods explained in the foregoing, a solder or a brazing material is thickly applied to the connecting surface of the substrate body so as to fill and cover the recesses and the protrusions. In this case, for reliably filling and covering the recesses and the protrusions, the thickly applied coating layer may be once heated to melt and then cooled to solidify. Next, by polishing the coating layer such that the thickness in the smooth region becomes 1 μm to 30 μm, a coating layer that satisfies the above-mentioned conditions is formed.

The thickness of the coating layer in a smooth region is limited to 1 μm to 30 μm for the following reason. That is, with a thickness of less than 1 μm, the amount of a solder or brazing material to form a coating layer interposed between the connecting surface and another member is insufficient, so that when the coating layer is heated to melt in order to connect another member, due to the recesses and protrusions existing on the connecting surface of the substrate body, unevenness is likely to occur in the coating layer, and when the unevenness occurs, another member cannot be connected via the coating layer to the connecting surface of the substrate body in a closely adhered state without a gap. In the case that the thickness is more than 30 μm, since a large amount of solder or blazing material exists between the connected substrate body and another member, the thermal conductivity therebetween declines.

On the other hand, when the thickness of the coating layer in the smooth region is 1 μm to 30 μm, it becomes possible to connect another member via the coating layer to the connecting surface of the substrate body in a closely adhered state without a gap while preventing a decline in the thermal conductivity between the substrate body and another member. In consideration of further favorably exerting these effects, it is preferable that the thickness of the connecting surface of the coating layer in a smooth region, other than the recesses and protrusions is 1 μm to 20 μm, and particularly 3 μm to 7 μm, even within the range.

For a coating layer, it is necessary that an arithmetic mean roughness $R_a$ of a roughness curve, showing a surface roughness of its surface, is within a range of $R_a \leq 2$ μm and a maximum height roughness $R_z$ is within a range of $R_z \leq 15$ μm. This makes it possible to increase smoothness of the surface of the coating layer and to connect another member via the coating layer to the connecting surface of the substrate body in a closely adhered state without a gap. Also, in consideration of further favorably exerting the effects, the arithmetic mean roughness $R_a$ of a roughness curve is preferably 1 μm or less even within the range, and the maximum height roughness $R_z$ is preferably 5 μm or less even within the range. For finishing the surface of the coating layer so as to have the above surface roughness, the surface is preferably processed by lapping or the like. Particularly, in consideration of simplifying the process for forming a coating layer, it is preferable to finish the surface of a coating layer so as to have the above surface roughness, while performing polishing to adjust the thickness of the coating layer in the smooth region explained in the foregoing.

The coating layer may have a single layer structure, but may have a double layer structure formed of a first coating layer formed on the connecting surface of the substrate body, and a second coating layer formed of a solder or brazing material lower in melting point than the solder or brazing material to form the first coating layer and laminated on the first coating layer. According to the coating layer with the double layer structure by, for example, setting the heating temperature when connecting a semiconductor element to an element mounting surface or when connecting another heat transferring member to a heat transfer surface lower than a melting temperature of the first coating layer and higher than a melting temperature of the second coating layer, the first coating layer is prevented from melting when being heated, and the first coating layer can be maintained in a solid state.

Therefore, by melting the second coating layer while maintaining a state where recesses and protrusions on the surface of a substrate body are filled and covered by the first coating layer, a semiconductor element can be connected to an element mounting surface, or another heat transferring member can be connected to a heat transfer surface, so that a decline in thermal conduction efficiency due to a gap or voids formed between the substrate body and another member can be reliably prevented. In the coating layer with the double layer structure, it is necessary that the total thickness of both the coating layers is 1 μm to 30 μm in a smooth region other than the recesses and protrusions. Moreover, it is necessary that the surface roughness of the surface of the second coating layer is within the range mentioned above.

The first and second coating layers are, in consideration of adhesion and the like between both the layers, preferably formed of solders or brazing materials that are of the same base but different composition distribution and are particularly lead-free, and more preferably formed of Au—Sn-based, In—Sn-based or Au—Ge-based solders or brazing materials. For example, when the first coating layer is formed of an Au—Sn-based solder or brazing material with 80% by weight of Au and 20% by weight of Sn, and the second coating layer is formed of a solder or brazing material with 10% by weight of Au and 90% by weight of Sn and lower in melting temperature than the solder or brazing material to form the first coating layer, adhesion between both the coating layers is improved while the effect of forming the coating layer with the double layer structure, explained in the foregoing, is maintained, so that the strength of connection, to the substrate body, of another member to be connected onto the coating layer can be increased.

Also, the first coating layer may be formed by laminating a precursor layer formed of a solder or brazing material of the same or a different composition of the second coating layer and an adjustment layer laminated under or on the precursor layer for adjusting the composition of the solder or brazing material to form the precursor layer to the composition of the first coating layer and formed of at least one type of metal selected from a group consisting of, for example, In, Sn, Ag, Au, Ge, Si, Cu and Al, and then heating to fuse both the layers to each other.

The first and second coating layers and the precursor layers and adjustment layer to be the first coating layer can be formed by the conventionally known various film forming methods, such as a vacuum deposition method, a sputtering method, an ion plating method, a chemical plating method, and an electroplating method. Moreover, the first and second coating layers and the precursor layer to be thickly applied may be formed by heating to melt a foil-like preform formed of a solder or a brazing material in a state of being laminated on the connecting surface of the substrate body. It is sufficient to set the thicknesses of the adjustment layer and precursor layer to thicknesses corresponding to the amount of metal required for adjusting the first coating layer to be formed by fusing both the layers to each other to a predetermined composition.

For forming a coating layer with a double layer structure, for example, first, in the same manner as in the case of a coating layer with a single layer structure, the first coating layer is formed by thickly applying on the connecting surface of the substrate body, a solder or brazing material to be the first coating layer so as to fill and cover recesses and protrusions, and next the first coating layer is heated to melt in order to reliably fill and cover the recesses and protrusions, and then is cooled to solidify, and further, the solidified first coating layer is polished to have a predetermined thickness.

Moreover, when the first coating layer is formed by fusing the precursor layer and the adjustment layer to each other, the first coating layer is formed by adjusting the composition through the fusing, and the first coating layer at the same time, reliably fills and covers the recesses and protrusions and then is cooled to solidify, and further, the solidified first coating layer is polished to have a predetermined thickness. Then, after a solder or brazing material to be the second coating layer is thickly applied onto the first coating layer, the second coating layer is finished by polishing such that the total thickness of a coating layer with a double layer structure is within the range mentioned above and the surface roughness of the surface of the second coating layer is within the range mentioned above, and thus a coating layer with a double layer structure is formed. Moreover, when polishing the first coating layer to have a predetermined thickness, by finishing its surface such that the surface roughness thereof is within the range mentioned above, and then thinly applying the second coating layer such that the total thickness of a coating layer with a double layer structure is within the above range, the polishing process of the second coating layer can be omitted.

Between the substrate body and the coating layer, an adhesion layer to improve adhesion between the substrate body and the coating layer may be formed. This can improve adhesion between the substrate body and the coating layer to increase the strength of connection, to the substrate body, of another member to be connected onto the coating layer. The adhesion layer is preferably formed of at least one type of metal selected from a group consisting of Ni, Au, Ti, and Cr.

The adhesion layer can be formed by the conventionally known various film forming methods, such as a vacuum deposition method, a sputtering method, an ion plating method, a chemical plating method, and an electroplating method. The thickness of the adhesion layer is preferably 0.01 µm to 10 µm. When the thickness is less than the range, the effect to improve adhesion between the substrate body and the coating layer, obtained by forming the adhesion layer, may not be sufficiently obtained, and when the thickness exceeds the range, thermal conduction efficiency between the connecting surface and another member connected to the connecting surface via the coating layer may decline.

Between the adhesion layer and the coating layer, a diffusion preventive layer to prevent the metal forming the adhesion layer from diffusing to the coating layer may be formed. This can prevent the metal from diffusing from the adhesion layer to change the composition of the solder or brazing material to form the coating layer when the coating layer is melted by heating when connecting a semiconductor element to an element mounting surface or when connecting another heat transferring member to a heat transfer surface. The diffusion preventive layer is preferably formed of at least one type of metal selected from a group consisting of Pt, Mo, and Pd.

The diffusion preventive layer can be formed by the conventionally known various film forming methods, such as a vacuum deposition method, a sputtering method, an ion plating method, a chemical plating method, and an electroplating method. The thickness of the diffusion preventive layer is preferably 0.01 µm to 1 µm. When the thickness is less than the range, the effect to prevent the metal forming the adhesion layer from diffusing to the coating layer, obtained by forming the diffusion preventive layer, may not be sufficiently obtained, and when the thickness exceeds the range, thermal conduction efficiency between the connecting surface and another member connected to the connecting surface via the coating layer may decline.

In a coating layer with a double layer structure, it is preferable to form the first coating layer of an Ag—Cu-based brazing material and form the second coating layer of a solder or brazing material of a base different from the Ag—Cu-based brazing material and lower in melting point than the Ag—Cu-based brazing material. In such a construction, since the Ag—Cu-based brazing material to form the first coating layer has a flowability higher than that of a solder or brazing material of an Au—Sn base or the like when being melted, by forming the first coating layer of the Ag—Cu-based brazing material, the recesses and protrusions on the connecting surface of the substrate body can be further reliably filled and covered with the first coating layer. Moreover, since an Ag—Cu-based brazing material is higher not only in thermal conductivity but also in melting point than a solder or brazing material of an Au—Sn base or the like, by forming the first coating layer of the Ag—Cu-based brazing material, thermal conduction efficiency of the first coating layer is improved, and connection durability of the first coating layer can also be improved.

In consideration of further improving adhesion of the first coating layer to the substrate body formed of the diamond composite material, it is preferable to use, as the Ag—Cu-based brazing material to form the first coating layer, an active Ag—Cu-based brazing material containing at least one of Cu, Ti, Nb and V at a ratio of approximately 5% by weight or less and having a favorable wettability to the substrate body. Forming the first coating layer using an active Ag—Cu-based brazing material has an advantage that it becomes unnecessary to form the adhesion layer or diffusion preventive layer explained in the foregoing between the first coating layer and the substrate body. Also, a small amount of In can be added to the Ag—Cu-based brazing material such as the active Ag—Cu-based brazing material to lower the melting point. The second coating layer is preferably formed of an Au—Sn-based, In—Sn-based, or Au—Ge-based solder or brazing material in consideration of connecting a semiconductor element or the like efficiently at a lower temperature without damaging the semiconductor element or the like.

For forming the coating layer with a double layer structure, for example, first, the first coating layer is formed by thickly applying on the connecting surface of the substrate body a brazing material to be the first coating layer so as to fill and cover recesses and protrusions, or a foil-like preform formed of an Ag—Cu-based brazing material in the state of being laminated on the connecting surface of the substrate body is heated to melt in order to reliably fill and cover the recesses and protrusions, and then cooled to solidify. In this case, when a heat treatment is performed in the state where a glass plate, a carbon plate or the like is laminated on the first coating layer or the preform and is in pressure contact therewith, the recesses and protrusions on the surface of the substrate body can be further reliably filled and covered with the molten Ag—Cu-based brazing material that receives pressure from the glass plate, carbon plate or the like. Moreover, an interface with the glass plate, carbon plate or the like to be the surface of the first coating layer can be finished as a smooth surface corresponding to a pressure-contact surface of the glass plate or the like.

Next, by separating the glass plate, carbon plate or the like laminated on the first coating layer thus formed or by removing the same through polishing, and polishing the solidified first coating layer so as to have a predetermined thickness, and then thickly applying a solder or brazing material to be the second coating layer onto the first coating layer, and then finishing the second coating layer through polishing such that the total thickness of a coating layer of a double layer structure is within the above range and the surface roughness of the surface of the second coating layer is within the above range, a coating layer with a double layer structure is formed. Moreover, when polishing the first coating layer to a predetermined thickness, by finishing the surface thereof such that the surface roughness is within the range mentioned above, and at the same time, thinly applying the second coating layer thereon such that the total thickness of the coating layer with a double layer structure is within the above range, a polishing process of the second coating layer can be omitted.

Between the first coating layer formed of an Ag—Cu-based brazing material and the second coating layer formed of a solder or brazing material of a base, such as the Au—Sn base, different from an Ag—Cu-based brazing material, an adhesion layer to improve adhesion between both the coating layers may be formed. This can improve adhesion between the first coating layer formed of an Ag—Cu-based brazing material and the second coating layer formed of a solder or brazing material of a different base to increase the strength of connection of another member to be connected onto the second coating layer to the substrate body. The adhesion layer is preferably formed of at least one type of metal selected from a group consisting of Ni, Au, Ti, and Cr.

The adhesion layer can be formed by the conventionally known various film forming methods, such as a vacuum deposition method, a sputtering method, an ion plating method, a chemical plating method, and an electroplating method. The thickness of the adhesion layer is preferably 0.01 µm to 10 µm. When the thickness is less than the range, the effect to improve adhesion between both coating layers, obtained by forming the adhesion layer, may not be sufficiently obtained, and when the thickness exceeds the range, thermal conduction efficiency between the connecting surface and another member connected to the connecting surface via the coating layer with a double layer structure may decline.

Between the adhesion layer and the second coating layer, a diffusion preventive layer to prevent the metal forming the adhesion layer from diffusing to the second coating layer may be formed. This can prevent, when the second coating layer is melted by heating the metal from diffusing from the adhesion layer to change the composition of the solder or brazing material to form the second coating layer when connecting a semiconductor element to an element mounting surface or when connecting another heat transferring member to a heat transfer surface. The diffusion preventive layer is preferably formed of at least one type of metal selected from a group consisting of Pt, Mo, and Pd.

The diffusion preventive layer can be formed by the conventionally known various film forming methods, such as a vacuum deposition method, a sputtering method, an ion plating method, a chemical plating method, and an electroplating method. The thickness of the adhesion layer is preferably 0.01 µm to 1 µm. When the thickness is less than the range, the effect to prevent the metal forming the adhesion layer from diffusing to the second coating layer, obtained by forming the diffusion preventive layer, may not be sufficiently obtained, and when the thickness exceeds the range, thermal conduction efficiency between the connecting surface and another member connected to the connecting surface via the second coating layer may decline.

A method for manufacturing a semiconductor element mounting substrate of the present invention includes the steps of:

finishing a connecting surface of a substrate body such that a number of at least either recesses or protrusions having a depth or height of 10 µm to 40 µm and a surface-direction diametrical size of 10 µm to 3 mm, per unit area of the connecting surface, is 50/cm$^2$ or less;

forming a coating layer to fill and cover the recesses or protrusions by thickly applying a solder or brazing material to at least the connecting surface of the substrate body; and finishing the coating layer so as to have a thickness in a region of the connecting surface other than the recesses or protrusions of 1 µm to 30 µm, an arithmetic mean roughness $R_a$ of a roughness curve showing a surface roughness of $R_a \leq 2$ µm, and a maximum height roughness $R_z$ of $R_z \leq 15$ µm.

According to the manufacturing method of the present invention, the semiconductor element mounting substrate of the present invention having excellent characteristics can be manufactured efficiently with a high productivity, as explained in the foregoing. Moreover, when the semiconductor element mounting substrate is finished so as to have a predetermined thickness and surface state through the step of once heating to melt the thickly applied coating layer and then cooling to solidify the same and the step of polishing the coating layer, the recesses and protrusions on the connecting surface can be reliably filled and covered with the molten solder or brazing material which forms the coating layer, so that it becomes possible to further reliably prevent the recesses from remaining as voids to hinder thermal conduction, in particular.

In a semiconductor device of the present invention, the semiconductor element mounting substrate of the present invention is cut out in a predetermined plane shape by laser processing or the like according to necessity, and then, a light emitting element serving as a semiconductor element is connected via the coating layer to an element mounting surface of the semiconductor element mounting substrate, serving as a connecting surface and coated with a coating layer. In the semiconductor device of the present invention, the light emitting element can be connected, as explained in the foregoing, via the coating layer to the element mounting surface in a closely adhered state without a gap. Therefore, heat generated from the light emitting element can be speedily transferred through the semiconductor element mounting substrate, so that it becomes possible to prevent the light emitting element from causing a defective operation by heat generation of itself and to make the light emitting element emit light for a longer period of time than before.

Moreover, when the semiconductor element mounting substrate has a heat transfer surface, for example, on a side opposite to the element mounting surface, another heat transferring member such as a metal substrate can be connected to the heat transfer surface via a coating layer still in a closely adhered state without a gap, so that heat generated from the light emitting element can be further speedily transferred through the semiconductor element mounting substrate and another heat transferring member. Therefore, it becomes possible to make the light emitting element emit light for a further longer period of time.

EXAMPLES

Example 1

Fabrication of Substrate Body

A mixture in which diamond particles with an average particle diameter of 15 μm and Cu powder are blended such that the ratio of the diamond particles in the total volume of a diamond composite material becomes 60% by volume was preformed under a condition of a pressure of 2 t/cm$^2$, and then sealed in a vacuum into a capsule formed of molybdenum. Then, under a condition of a pressure of 5 Gpa and a heating temperature of 1100° C., the capsule was heated for 5 minutes while being pressurized, and then while the pressure was maintained, the temperature was lowered to 500° C. or less and held for 30 minutes, and then the pressure and temperature were returned normal, and the capsule was collected.

Next, by grinding the surface of the collected capsule, molybdenum was removed to extract a sintered compact, and the extracted sintered compact was cut out in a plate form by electrical discharge machining, and then one surface of the plate was flat-polished by use of a #140 diamond whetstone for 2 hours so as to be an element mounting surface, whereby a substrate body having a thickness of 0.3 mm was fabricated. The number, per unit area, of recesses and protrusions having a depth or height of 10 μm to 40 μm and a surface-direction diametrical size of 10 μm to 3 mm, on the element mounting surface, determined by the measuring method explained in the foregoing, was 25/cm$^2$.

(Manufacturing of Semiconductor Element Mounting Substrate)

On the element mounting surface of the substrate body, an Ni layer having a thickness of 1.5 μm was formed as an adhesion layer by electroplating and thereafter a Pt layer having a thickness of 0.2 μm was formed as a diffusion preventive layer by a sputtering method, and then on the diffusion preventive layer, an Au—Si alloy layer (Au: 80.0% by weight, Sn: 20.0% by weight) having a thickness of 15 μm was formed as a coating layer by a vacuum deposition method. Then, the coating layer was lapped so as to have a thickness in a region other than the recesses and protrusions of 3 μm, an arithmetic mean roughness $R_a$ of a roughness curve showing a surface roughness of 1.5 μm, and a maximum height roughness $R_z$ of 13 μm. Thus, a semiconductor element mounting substrate was manufactured.

Fifty samples of semiconductor devices were produced by cutting out the semiconductor element mounting substrate through laser processing so as to have rectangular forms each with an element mounting surface of 10 mm long×2 mm wide (the thickness of the substrate body was 0.3 mm as explained in the foregoing), and then mounting a semiconductor laser serving as a light emitting element on the element mounting surface, and for each sample, an initial light emission quantity was measured, and a light emission quantity after a continuous emission for 200 hours was measured. Then, when the number of samples (number of defectives) showing a decline in light emission quantity of 20% or more was counted, the count was 5, and in 45 other samples, a decline in light emission quantity could be suppressed within 20%.

Example 2

A semiconductor element mounting substrate was manufactured in the same manner as in Example 1 except that a coating layer was lapped so as to have a thickness in a region other than the recesses and protrusions of 3 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 0, and thus in all 50 samples, a decline in light emission quantity could be suppressed within 20%.

Comparative Example 1

A semiconductor element mounting substrate was manufactured in the same manner as in Example 1 except that a coating layer was lapped so as to have a thickness in a region other than the recesses and protrusions of 3 μm, an arithmetic mean roughness $R_a$ of a roughness curve showing a surface roughness of 2.9 μm, and a maximum height roughness $R_z$ of 21 μm. Then, the semiconductor element mounting substrate was used to produce 50 samples of semiconductor devices, and when the number of defectives was counted by performing the same measurements as in Example 1, 25 samples (a half) were defective.

Example 3

A semiconductor element mounting substrate was manufactured in the same manner as in Example 1 except that an initial thickness of a coating layer was 30 μm and the coating layer was lapped so as to have a thickness in a region other than the recesses and protrusions of 15 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 1, and in 49 other samples, a decline in light emission quantity could be suppressed within 20%.

Example 4

A semiconductor element mounting substrate was manufactured in the same manner as in Example 1 except that an initial thickness of a coating layer was 30 μm and the coating layer was lapped so as to have a thickness in a region other than the recesses and protrusions of 18 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 6, and in 44 other samples, a decline in light emission quantity could be suppressed within 20%.

Comparative Example 2

A semiconductor element mounting substrate was manufactured in the same manner as in Example 1 except that an initial thickness of a coating layer was 40 μm and the coating layer was lapped so as to have a thickness in a region other than the recesses and protrusions of 35 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, 23 samples were defective.

Example 5

A semiconductor element mounting substrate was manufactured in the same manner as in Example 1 except that a Ti layer having a thickness of 0.1 μm was formed as an adhesion layer by a sputtering method and a coating layer was lapped so as to have a thickness in a region other than the recesses and protrusions of 3 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Example 6

A semiconductor element mounting substrate was manufactured in the same manner as in Example 1 except that a Ti layer having a thickness of 0.1 μm was formed as an adhesion layer by a sputtering method, an Mo layer having a thickness of 0.2 μm was formed as a diffusion protective layer by the same sputtering method, and a coating layer was lapped so as to have a thickness in a region other than the recesses and protrusions of 3 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Example 7

A semiconductor element mounting substrate was manufactured in the same manner as in Example 1 except that an Au—Sn alloy layer (Au: 10.0% by weight, Sn: 90.0% by weight) having a thickness of 15 μm was formed as a coating layer by a vacuum deposition method on a diffusion preventive layer, and that the coating layer was lapped so as to have a thickness in a region other than the recesses and protrusions of 3 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Example 8

A semiconductor element mounting substrate was manufactured in the same manner as in Example 1 except that an In—Sn alloy layer (In: 52.0% by weight, Sn: 48.0% by weight) having a thickness of 15 μm was formed as a coating layer by a vacuum deposition method on a diffusion preventive layer, and that the coating layer was lapped so as to have a thickness in a region other than the recesses and the protrusions of 3 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Example 9

A semiconductor element mounting substrate was manufactured in the same manner as in Example 1 except that an Au—Ge alloy layer (Au: 88.0% by weight, Ge: 12.0% by weight) having a thickness of 15 μm was formed as a coating layer by a vacuum deposition method on a diffusion preventive layer, and that the coating layer was lapped so as to have a thickness in a region other than the recesses and protrusions of 3 μm, an arithmetic mean roughness $R_a$ of a roughness curve showing a surface roughness of 0.8 μm, and a maximum height roughness $R_z$ of 7.5 μm. Then, the semiconductor element mounting substrate was used to produce 50 samples of semiconductor devices, and when the number of defectives was counted by performing the same measurements as in Example 1, the count was 0, and thus in all 50 the samples, a decline in light emission quantity could be suppressed within 20%.

Example 10

On a diffusion preventive layer formed in the same manner as in Example 1, an Au—Sn alloy layer (Au: 80.0% by weight, Sn: 20.0% by weight) having a thickness of 7 μm as a first coating layer was formed by a vacuum deposition method, and then the first coating layer was heated to melt at 320° C. for 3 minutes, and then cooled to solidify. Then, the solidified first coating layer was lapped to have a thickness in a region other than the recesses and protrusions of 1.5 μm.

Next, an Au—Sn alloy layer (Au: 10.0% by weight, Sn: 90.0% by weight) having a thickness of 7 μm was formed as a second coating layer on the first coating layer by a vacuum deposition method, and the second coating layer was lapped so as to have a total thickness of the first and second coating layers in a region other than the recesses and protrusions of 3 μm, an arithmetic mean roughness $R_a$ of a roughness curve showing a surface roughness of 0.8 μm, and a maximum height roughness $R_z$ of 7.5 μm, and thus a semiconductor element mounting substrate was manufactured. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Example 11

On a diffusion preventive layer formed in the same manner as in Example 1, an Au layer having a thickness of 0.5 μm as an adjustment layer was formed by a vacuum deposition method, and then, on the adjustment layer, an Au—Sn alloy layer (Au: 20.0% by weight, Sn: 80.0% by weight) having a thickness of 7 μm as a precursor layer was formed by a vacuum deposition method, and both the layers were heated at 320° C. for 3 minutes to be fused to each other, and then cooled to solidify. Thus, a first coating layer was formed. Then, the solidified first coating layer was lapped to have a thickness in a region other than the recesses and protrusions of 1.5 μm.

Next, on the first coating layer, an Au—Sn alloy layer (Au: 20.0% by weight, Sn: 80.0% by weight) having a thickness of 7 μm was formed as a second coating layer by a vacuum deposition method, and the coating layer was lapped so as to have a total thickness of the first and second coating layers in a region other than the recesses and protrusions of 3 μm, an arithmetic mean roughness $R_a$ of a roughness curve showing a surface roughness of 0.8 μm, and a maximum height roughness $R_z$ of 7.5 μm. Thus, a semiconductor element mounting substrate was manufactured. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Example 12

On an element mounting surface of a substrate body fabricated in the same manner as in Example 1, a foil-like preform [thickness 15 μm, Ag: 63.0% by weight, Cu: 34.0% by weight, Ti: 3% by weight] formed of an active Au—Cu brazing material to be a first coating layer was laminated, and both surfaces of the laminate were sandwiched between a pair of carbon plates so as to be brought into pressure contact with each other, and in this condition, the preform was heated at 850° C. for 5 minutes to melt and then cooled to solidify. Then, after the carbon plate laminated on the first coating layer thus formed was removed by polishing, the first coating layer was lapped so as to have a thickness in a region other than the recesses and protrusions of 10 μm, an arithmetic mean roughness $R_a$ of a roughness curve showing a surface roughness of 0.8 μm, and a maximum height roughness $R_z$ of 7.5 μm.

Next, on the first coating layer, an Ni layer having a thickness of 1.5 μm was formed as an adhesion layer by electroplating, and then a Pt layer having a thickness of 0.2 μm was formed as a diffusion preventive layer by a sputtering method, and thereafter on the diffusion preventive layer, an Au—Sn alloy layer (Au: 80.0% by weight, Sn: 20.0% by weight) having a thickness of 3 μm was formed as a second coating layer by a vacuum deposition method. Thus, a semiconductor element mounting substrate having an arithmetic mean roughness $R_a$ of a roughness curve showing a surface roughness of 1.0 μm, and a maximum height roughness $R_z$ of 9.0 μm was manufactured. Then, the semiconductor element mounting substrate was used to produce 50 samples of semiconductor devices, and when the number of defectives was counted by performing the same measurements as in Example 1, the count was 0, and thus in all the 50 samples, a decline in light emission quantity could be suppressed within 20%.

Comparative Example 3

On the element mounting surface of the substrate body fabricated in Example 1, a Cu layer having a thickness of 13 μm was formed by electroplating, on the Cu layer, an Ni layer having a thickness of 1.5 μm was formed as an adhesion layer by electroplating, and then a Pt layer having a thickness of 0.2 μm was formed as a diffusion preventive layer by a sputtering method, and then further, on the diffusion preventive layer, an Au—Sn alloy layer (Sn is 80.0% by weight) having a thickness of 3 μm was formed by a vacuum deposition method. Thus, a conventional semiconductor element mounting substrate described in Patent Document 4 was manufactured. Then, the semiconductor element mounting substrate was used to produce 50 samples of semiconductor devices, and when the number of defectives was counted by performing the same measurements as in Example 1, 22 samples were defective. It is considered that a large number of defectives occurred in Comparative Example 3 because unevenness on the surface of the substrate body could not be sufficiently filled and covered up by only forming the Cu layer having a thickness of 13 μm by electroplating. The above results are listed in Table 1.

TABLE 1

|  | Number of Defective | Defective Rate (%) |
| --- | --- | --- |
| Example 1 | 5 | 10 |
| Example 2 | 0 | 0 |
| Comparative Example 1 | 25 | 50 |
| Example 3 | 1 | 2 |
| Example 4 | 6 | 12 |
| Comparative Example 2 | 23 | 46 |
| Example 5 | 0 | 0 |
| Example 6 | 0 | 0 |
| Example 7 | 0 | 0 |
| Example 8 | 0 | 0 |
| Example 9 | 0 | 0 |
| Example 10 | 0 | 0 |
| Example 11 | 0 | 0 |
| Example 12 | 0 | 0 |
| Comparative Example 3 | 22 | 44 |

Reference Example 1

The substrate body itself fabricated in Example 1, in the state before the respective layers were formed on its element mounting surface, was used as a semiconductor element mounting substrate of Reference Example 1. With respect to the semiconductor element mounting substrate manufactured in Reference Example 1 and the semiconductor element mounting substrates manufactured in Examples 1, 2, 6 to 8, 10 and 11 and Comparative Example 3 explained in the foregoing, respective thermal conductivities were measured by AC calorimetry. More specifically, the semiconductor element mounting substrate manufactured in each of the above-mentioned examples, comparative example, and reference example was cut out by laser processing so as to have a rectangular form with an element mounting surface of 10 mm long×4 mm wide (the thickness of the substrate body was 0.3 mm as explained in the foregoing). Thus, a measuring sample was fabricated.

Next, the sample was placed on a specimen support of a laser-heating Angstrom method thermal diffusivity/conductivity meter [PIT-R1 manufactured by ULVAC-RIKO, Inc.], and at a room temperature (5° C. to 35° C.) and in the atmosphere, an operation to irradiate the element mounting surface of the sample with band-like laser light periodically at a constant frequency so as to impart thermal energy was performed while changing the position irradiated with the laser light. Then, by a thermocouple made to contact a surface of the sample opposite to the element mounting surface, a change in temperature of the opposite surface was measured to determine thermal diffusivity $\alpha$, and based on the determined thermal diffusivity $\alpha$, thermal conductivity of each semiconductor element mounting substrate was determined by a formula (1):

$$\lambda = C_P \times \alpha \times \rho \tag{1}$$

[In the formula, $\lambda$ represents thermal conductivity, $C_P$ represents specific heat of the substrate body, and $\rho$ represents density of the substrate body.]

The results are shown in Table 2.

TABLE 2

|  | Thermal Conductivity (W/m · K) |
| --- | --- |
| Reference Example 1 | 521 |
| Example 1 | 421 |
| Example 2 | 433 |
| Example 6 | 441 |
| Example 7 | 412 |
| Example 8 | 403 |
| Example 10 | 424 |
| Example 11 | 409 |
| Comparative Example 3 | 301 |

It was understood from the result of Comparative Example 3 in Table 2 that, in the conventional semiconductor element mounting substrate described in Patent Document 4, since the thermal conductivity of Cu is lower than the thermal conductivity of the diamond composite material, the thermal conductivity as a whole is considerably lower than the thermal conductivity of the substrate body alone (Reference Example 1) formed of the diamond composite material. On the other hand, it was confirmed from the result of each example that, in the semiconductor element mounting substrate of the present invention, the thermal conductivity as a whole can be made closer to the thermal conductivity of the substrate body alone.

What is claimed is:

1. A semiconductor element mounting substrate comprising:

a substrate body formed of a diamond composite material in which a number of diamond particles are bonded by a bonding material, the substrate body having a finished connecting surface to be connected with another member such that a number of at least either recesses or protrusions having a depth or height of 10 µm to 40 µm and a surface-direction diametrical size of 10 µm to 3 mm, per unit area of the finished connecting surface, is between 3/cm$^2$ and 50/cm$^2$, on at least the finished connecting surface of the substrate body, a coating layer formed of a solder or a brazing material being formed in a manner filling and covering the recesses or protrusions, and the coating layer having a thickness in a region of the finished connecting surface other than the recesses or protrusions of 1 µm to 30 µm, an arithmetic mean roughness $R_a$ of a roughness curve showing a surface roughness of $R_a \leq 2$ µm, and a maximum height roughness $R_z$ of $R_z \leq 15$ µm.

2. The semiconductor element mounting substrate according to claim 1, wherein the bonding material to form the substrate body is at least one type substance selected from a group consisting of Cu, Ag, Si, and SiC.

3. The semiconductor element mounting substrate according to claim 1, wherein the substrate body has a thermal conductivity of 200 W/m·K or more.

4. The semiconductor element mounting substrate according to claim 1, wherein the substrate body has a thermal expansion coefficient of $10 \times 10^{-6}$/K or less.

5. The semiconductor element mounting substrate according to claim 1, wherein the coating layer is formed of a solder or brazing material containing at least one type of metal selected from a group consisting of In, Sn, Ag, Au, Ge, Si, Cu, Ti, Nb, V, and Al.

6. The semiconductor element mounting substrate according to claim 5, wherein the coating layer is formed of an Au—Sn-based, In—Sn-based, or Au—Ge-based solder or brazing material.

7. The semiconductor element mounting substrate according to claim 1, wherein the coating layer includes a first coating layer formed of a solder or a brazing material and formed on the finished connecting surface of the substrate body, and a second coating layer formed of a solder or brazing material having a melting point lower than the solder or brazing material to form the first coating layer and laminated on the first coating layer.

8. The semiconductor element mounting substrate according to claim 7, wherein the first coating layer and the second coating layer are formed of solders or brazing materials of the same base but different composition distribution.

9. The semiconductor element mounting substrate according to claim 8, wherein the first coating layer and the second coating layer are formed of an Au—Sn-based, In—Sn-based, or Au—Ge-based solder or brazing material.

10. The semiconductor element mounting substrate according to claim 7, wherein the first coating layer is formed of an Ag—Cu-based brazing material and the second coating layer is formed of a solder or brazing material of a base different from the Ag—Cu-based brazing material and having a melting point lower than the Ag—Cu-based brazing material.

11. The semiconductor element mounting substrate according to claim 10, wherein the Ag—Cu-based brazing material forming the first coating layer is an active Ag—Cu-based brazing material containing at least one of Cu, Ti, Nb, and V.

12. The semiconductor element mounting substrate according to claim 10, wherein the second coating layer is formed of an Au—Sn-based, In—Sn-based, or Au—Ge-based solder or brazing material.

13. A semiconductor element mounting substrate comprising:
- a substrate body formed of a diamond composite material in which a number of diamond particles are bonded by a bonding material and which has a connecting surface to be connected with another member; wherein
- the connecting surface of the substrate body is finished such that a number of at least either recesses or protrusions having a depth or height of 10 μm to 40 μm and a surface-direction diametrical size of 10 μm to 3 mm, per unit area of the connecting surface, is 50/cm² or less;
- on at least the connecting surface of the substrate body, a coating layer formed of a solder or a brazing material is formed in a manner filling and covering the recesses or protrusions;
- the coating layer has a thickness in a region of the connecting surface other than the recesses or protrusions of 1 μm to 30 μm, an arithmetic mean roughness $R_a$ of a roughness curve showing a surface roughness of $R_a \leq 2$ μm, and a maximum height roughness $R_z$ of $R_z \leq 15$ μm;
- the coating layer includes a first coating layer formed of a solder or a brazing material and formed on the connecting surface of the substrate body, and a second coating layer formed of a solder or brazing material having a melting point lower than the solder or brazing material to form the first coating layer and laminated on the first coating layer;
- the first coating layer is formed of an Ag—Cu-based brazing material and the second coating layer is formed of a solder or brazing material of a base different from the Ag—Cu-based brazing material and having a melting point lower than the Ag—Cu-based brazing material; and
- between the first coating layer and the second coating layer, an adhesion layer made of at least one type of metal selected from a group consisting of Ni, Au, Ti and Cr or a compound containing the metal is formed.

14. The semiconductor element mounting substrate according to claim 13, wherein between the adhesion layer and the second coating layer, at least one diffusion preventive layer made of at least one type of metal selected from a group consisting of Pt, Mo and Pd is formed.

15. A semiconductor device, wherein a light emitting element serving as a semiconductor element is connected via the coating layer to the connecting surface coated with the coating layer, of the semiconductor element mounting substrate according to claim 13.

16. The semiconductor element mounting substrate according to claim 1, wherein between the substrate body and the coating layer, an adhesion layer made of at least one type of metal selected from a group consisting of Ni, Au, Ti and Cr or a compound containing the metal is formed.

17. The semiconductor element mounting substrate according to claim 16, wherein between the adhesion layer and the coating layer, a diffusion preventive layer having at least one layer and made of at least one type of metal selected from a group consisting of Pt, Mo and Pd is formed.

18. A semiconductor device, wherein a light emitting element serving as a semiconductor element is connected via the coating layer to the connecting surface coated with the coating layer, of the semiconductor element mounting substrate according to claim 1.

* * * * *